United States Patent
Park et al.

(10) Patent No.: US 9,403,713 B2
(45) Date of Patent: Aug. 2, 2016

(54) GLASS COMPOSITION FOR HIGH-RELIABILITY CERAMIC PHOSPHOR PLATE AND CERAMIC PHOSPHOR

(71) Applicants: LG INNOTEK CO., LTD., Seoul (KR); DAE JOO ELECTRONIC MATERIALS CO., LTD., Siheung-si, Gyeonggi-do (KR)

(72) Inventors: Jin Gyeong Park, Seoul (KR); Sung Hoon Kim, Seoul (KR); Ju Yeon Won, Seoul (KR); In Jae Lee, Seoul (KR); Joon-Geol Park, Suwon-si (KR); Ji-Hun Lee, Anyang-si (KR); In-Hee Cho, Anseong-si (KR); Hye-Sung Lee, Siheung-si (KR)

(73) Assignees: LG INNOTEK CO., LTD., Seoul (KR); DAE JOO ELECTRONIC MATERIALS CO. LTD., Siheung-Si (KR)

( * ) Notice: Subject to any disclaimer, the term of this patent is extended or adjusted under 35 U.S.C. 154(b) by 0 days.

(21) Appl. No.: 14/618,034

(22) Filed: Feb. 10, 2015

(65) Prior Publication Data

US 2015/0225281 A1    Aug. 13, 2015

(30) Foreign Application Priority Data

Feb. 10, 2014    (KR) .................. 10-2014-0014780

(51) Int. Cl.
| | |
|---|---|
| *H01J 1/62* | (2006.01) |
| *C03C 3/066* | (2006.01) |
| *C03C 14/00* | (2006.01) |
| *H05B 33/00* | (2006.01) |
| *C09K 11/02* | (2006.01) |
| *C09K 11/77* | (2006.01) |
| *H01S 5/183* | (2006.01) |
| *H05B 33/14* | (2006.01) |

(52) U.S. Cl.
CPC ............... *C03C 3/066* (2013.01); *C03C 14/006* (2013.01); *C09K 11/02* (2013.01); *C09K 11/7706* (2013.01); *H01S 5/183* (2013.01); *H05B 33/00* (2013.01); *H05B 33/14* (2013.01); *C03C 2214/16* (2013.01)

(58) Field of Classification Search
CPC ..... C03C 4/006; C03C 2214/16; H05B 33/00
USPC ............... 313/503, 506, 485, 486; 501/47, 48
See application file for complete search history.

(56) References Cited

U.S. PATENT DOCUMENTS

| | | |
|---|---|---|
| 3,461,078 A | 8/1969 | Veres |
| 2005/0113241 A1 | 5/2005 | Yamamoto et al. |
| 2005/0231118 A1 | 10/2005 | Fujimine et al. |
| 2007/0078047 A1 | 4/2007 | Tanida et al. |
| 2008/0081198 A1 | 4/2008 | Onoda et al. |

FOREIGN PATENT DOCUMENTS

| | | |
|---|---|---|
| JP | 2001-199737 A | 7/2001 |
| JP | 2007-217271 A | 8/2007 |

OTHER PUBLICATIONS

European Search Report issued in Application No. 15154524.1 dated May 15, 2015.

*Primary Examiner* — Vip Patel
(74) *Attorney, Agent, or Firm* — KED & Associates, LLP

(57) ABSTRACT

Provided is a glass composition for a ceramic phosphor plate, including: 75 to 85 mol % of an oxide mixture composed of $SiO_2$, $B_2O_3$ and ZnO; 10 to 15 mol % of at least one carbonate compound including an alkali metal; and 1 to 5 mol % of $Al_2O_3$, wherein a content of $B_2O_3$ is less than 25 mol %.

15 Claims, 5 Drawing Sheets

GLASS COMPOSITION FOR HIGH-RELIABILITY CERAMIC PHOSPHOR PLATE AND CERAMIC PHOSPHOR

CROSS-REFERENCE TO RELATED APPLICATION

This application claims priority under 35 U.S.C. §119 to Korean Application No. 10-2014-0014780 filed on Feb. 10, 2014, in the Korean Intellectual Property Office, whose entire disclosure is hereby incorporated by reference.

BACKGROUND

1. Field

Embodiments of the present disclosure relate to a glass composition for a ceramic phosphor plate and a ceramic phosphor plate manufacturing by using the glass composition.

2. Background

A white LED (Light Emitting Diode) is in the spotlight as a light source for white lighting having high efficiency and high reliability and has been already used as a small sized light source having small power consumption. Even though there are various methods of implementing a white LED, the most commonly used method is a method of molding a blue LED element with a matrix made of resin with a yellow phosphor. However, since blue light has strong energy, it may easily cause deterioration of the resin. Accordingly, since the white LED having such a structure causes discoloration of the resin when being used for a long time, the color of light emitted from the white LED is changed. Also, since the molding is performed with resin, heat emission from the element may not be easily performed, so it is easy to increase a temperature. Due to this increase of the temperature, it is problematic in that the color of emitted light is changed to yellow.

In order to solve these problems, a phosphor plate in which a ceramic pellet is used as the matrix material of a phosphor has been applied. The phosphor used in such a phosphor plate is only limited to an oxide phosphor, in particular, a YAG (Yttrium Aluminum Garnet) phosphor. When merely the oxide phosphor is used, it is difficult to implement various color coordinates and color temperatures. Also, when merely a phosphor such as a YAG and the like is applied, a heat-resisting temperature is required to be 800 °C. or more, and accordingly, the compositional condition of glass is not needed to become complicated. However, in order to implement various color temperatures, a red phosphor and a yellow phosphor should be mixed in an appropriate amount. To do so, there is a need to adjust the compositional condition of glass in order to reduce a sintering temperature because these phosphors are vulnerable to heat.

However, when the phosphor plate is used for a long time, the transmittance of glass may be deteriorated and whitening in which a surface of the phosphor plate becomes hazy may be generated due to a compositional reaction of moisture and the glass in terms of properties of the materials (see FIG. 1). With regard to the whitening, elements based on B, Na, and Li may have an influence on the whitening. However, in particular, it is known that a hydrate is easily formed by Na. FIG. 2 shows a mechanism that a whitening phenomenon is generated by the formation of a hydrate due to moisture and glass elements, in particular, Na.

BRIEF DESCRIPTION OF THE DRAWINGS

The embodiments will be described in detail with reference to the following drawings in which like reference numerals refer to like elements wherein.

DETAILED DESCRIPTION

Figure 1:
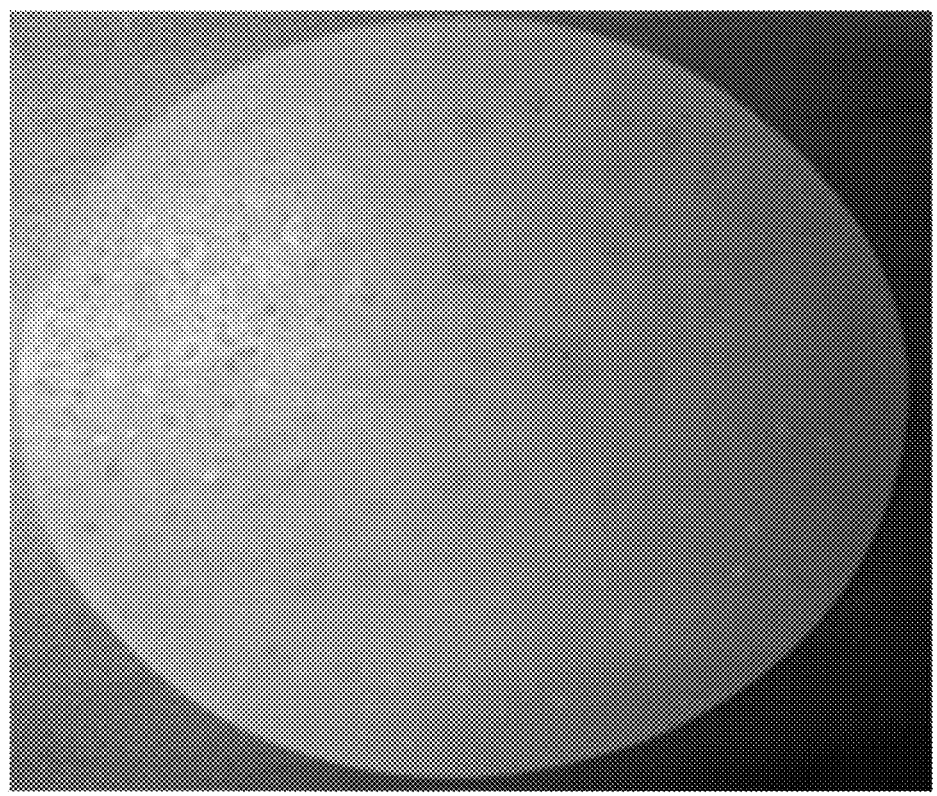
FIG. 1 is a photo resulting from capturing a surface of a conventional phosphor plate in which a whitening phenomenon is generated.
Figure 2:
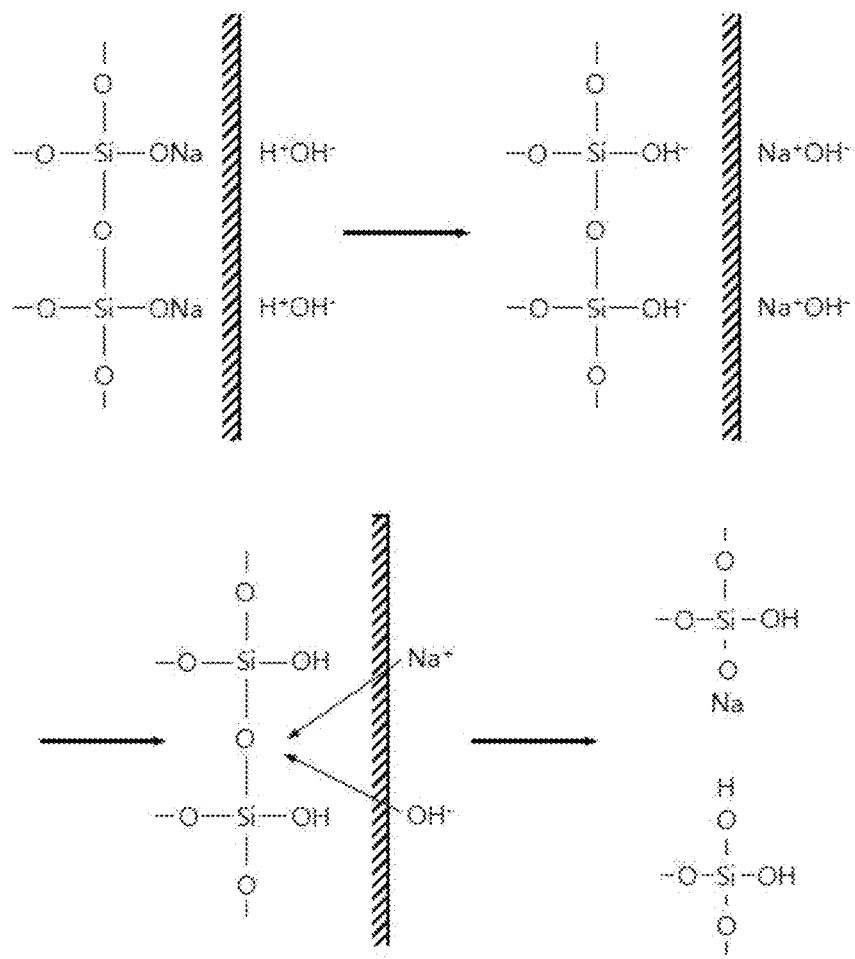
FIG. 2 is a mimetic diagram illustrated for explaining a mechanism in which the conventional phosphor plate causes a whitening phenomenon.

Hereinafter, the embodiments of the present disclosure that an ordinary person skilled in the art can implement will be described with reference to the accompanying drawings. The embodiments in the specification and the constructions shown in the drawings are provided as a preferred embodiment of the present disclosure, and it should be understood that there may be various equivalents and modifications which could substitute at the time of filing. In addition, when it comes to the operation principle of the preferred embodiments of the present disclosure, when the known functions or functions are seemed to make unclear the subject matters of the present disclosure, they will be omitted from the descriptions of the disclosure. The terms below are defined in consideration of the functions of the present disclosure, and the meaning of each term should be interpreted by judging the whole parts of the present specification, and the elements having the similar functions and operations of the drawings are given the same reference numerals. As used herein, the singular forms are intended to include the plural forms as well, unless the context clearly indicates otherwise.

A glass composition for a ceramic phosphor plate according to an embodiment of the present disclosure contains: an oxide mixture composed of $SiO_2$, $B_2O_3$ and ZnO; at least one carbonate compound including an alkali metal; and $Al_2O_3$.

The oxide mixture composed of the $SiO_2$, $B_2O_3$ and ZnO is a material that forms the most basic structure when manufacturing glass via vitrification of the glass composition, and belongs to a network forming oxide or a mesh forming oxide among oxides forming the glass. The oxide mixture is the most basic component of the glass, and ternary glass may be produced with merely the composition.

The oxide mixture may be contained in an amount of 75 to 85 mol % based on the total amount of the composition. At this time, the ZnO and $SiO_2$ may be mixed at a ratio of 1:1.5 to 1:1.35. The $B_2O_3$ contained in the oxide mixture may be contained in an amount of less than 25 mol % based on the total amount of the composition. Despite the fact that $B_2O_3$ is a basic material necessary for forming glass, in a case where the $B_2O_3$ is used upon manufacturing a phosphor plate for a lighting device, according to an increase in a content of $B_2O_3$, optical properties such as reliability, light transmittance and the like may be largely reduced. In particular, the increase in a content of $B_2O_3$ may serve as a factor that has a large effect on whitening of the phosphor plate. More preferably, $B_2O_3$ may be contained in an amount of less than 15 mol % based on the total amount of the composition. At this time, a ratio of the ZnO to $B_2O_3$ may range from 0.35 to 0.75.

When the phosphor plate is manufactured, the glass frit constituting a matrix of the phosphor plate should have a low glass transition temperature Tg for reducing a sintering temperature. In order to reduce the glass transition temperature Tg, an alkali metal may be contained in the glass composition. In the present embodiment, 10 to 15 mol % of at least one carbonate compound containing an alkali metal is contained in the glass composition. The alkali metal may refer to an element corresponding to group I on the periodic table such as K, Na, Li or the like. A compound such as $K_2CO_3$, $Na_2CO_3$, $Li_2CO_3$, a mixture thereof, or the like may be used as the carbonate compound. A compound resulting from mixing at least two compounds may be used as the carbonate compound. However, when the amount of an alkali metal component in the glass composition is increased, the glass composition may not be glassified, or optical properties of the phosphor plate may be deteriorated. Therefore, it is preferable that a total content of the alkali metal component does not exceed 15 mol %.

The glass composition includes 1 to 5 mol % of $Al_2O_3$. The $Al_2O_3$ may improve a crystallization property of the glass composition and may increase a chemical property. Furthermore, The $Al_2O_3$ may function to prevent alkali exudation. However, since the $Al_2O_3$ is a highly reactive component, it is preferable that a content of the $Al_2O_3$ does not exceed 5 mol %.

As an additional component, $P_2O_5$ may be contained in an amount of 5 mol % or less in the glass composition. The $P_2O_5$ functions to improve transmittance by promoting phase separation for minute and uniform phase slitting and vitrification. When a content of the $B_2O_3$ is reduced, transmittance may be reduced. However, this problem may be improved by adding $P_2O_5$. However, since the $P_2O_5$ is a highly reactive component, when the $P_2O_5$ is added in an excessive amount, there is a possibility of having an influence on reliability. Thus, it is preferable that the content of $P_2O_5$ does not exceed 5 mol %.

The ceramic phosphor plate according to another aspect of the present embodiment may include a matrix composed of a glass frit having an average particle diameter of 1 to 10 µm obtained by vitrification of the glass composition, and at least one phosphor.

The glass frit is mixed with the glass composition including an oxide mixture composed of $SiO_2$, $B_2O_3$ and ZnO, at least one carbonate compound containing an alkali metal, and $Al_2O_3$ for 40 to 50 hours using a ball mill, and then the mixture is put in a melting furnace. A melting process can be performed by adjusting a melting temperature according to each compositional condition of the glass composition. At this time, the melting temperature may be 1300 to 1600° C., and glass may be produced according to a conventional glass manufacturing process. The melting process is performed by selecting a temperature for enabling uniform dissolution of the materials contained in the glass composition. At this time, when the temperature is increased by more than 1600° C., the amount of a volatile component may be increased. The melted material is put in a twin roll and is subjected quenching to prepare a glass cullet. The glass frit is prepared by pulverizing the glass cullet.

The pulverizing method is divided into a dry pulverization method and a wet pulverization method. Examples of the dry pulverization method include methods using a ball mill, a vibration mill and the like. $Al_2O_3$ or $ZrO_2$ is generally used in a ceramic ball used in the ball mill method. Since the vibration mill method uses a vibration movement, the vibration mill has a large impact generated when the vibration mill is caught on a pulverized material. The wet pulverization method is a method of performing pulverization by stirring the pulverized material in a fluid and a ball. The wet pulverization may enable fine pulverizing compared to the dry pulverization. In addition to the ball mill, a medium agitation mill and a bead mill are used. The bead mill is a pulverizer in which a ceramic bead having a diameter of 0.5 to 2.0 mm and high wear resistance is used. An organic solvent such as water or ethanol may be used as the liquid used in the wet pulverization. In the case of glass having high water resistance, water is mainly used. In a case where a change in components may be generated upon using water, an organic solvent may be used.

The glass frit according to the present embodiment may have an average particle diameter of 1 to 10 µm, preferably, 2 to 7 µm. When the glass frit has a small particle diameter, internal porosity of the glass frit after sintering is reduced so that it can be effective to improve optical properties. In a case where the particle diameter of the glass frit is more than 10 µm, various pores may be formed upon performing sintering by mixing the glass frit with a phosphor later. On the contrary, when the particle diameter of the glass frit is less than 1 µm, the glass frit may not be sufficiently dispersed upon mixing with the phosphor. Thus, passivation of the phosphor may not be sufficiently performed. Furthermore, according to a milling time increase, since the degree of pollution is increased, it is difficult to maintain a whiteness index after sintering.

According to a desired optical property, the color of lighting, an application field and the like, the ceramic phosphor may be one phosphor of a yellow phosphor, a green phosphor and a red phosphor. According to circumstances, the ceramic phosphor may be at least two kinds of phosphors in which beams having different wavelengths are excited. An yttrium aluminum garnet (YAG)-based phosphor, a lutetium aluminum garnet (LuAG)-based phosphor, a nitride-based phosphor, a sulfide-based phosphor or a silicate-based phosphor may be used as the ceramic phosphor.

The ceramic phosphor is mixed in an amount of 1 to 15 mol % with respect to the glass frit. At this time, according to each transmittance and color difference after sintering, the amount of the mixed phosphor may be slightly changed. Also, according to the change of a thickness, the content of the phosphor may be changed. When the thickness of the phosphor is increased, the amount of the phosphor may be reduced.

The mixture of the glass frit and the ceramic phosphor is put into a SUS (Stainless Use Steel) mold and is subjected to uniaxial compression to have a plate or disc form. At this time, the compression is performed at 7 tons for 5 minutes. The mixture of the compressed inorganic phosphor-glass powder is subjected to firing in a state of being put in a firing furnace. A temperature and time for firing may be adjusted according to each glass transition temperature Tg of the inorganic phosphor and the glass powder.

The ceramic photo-conversion member subjected to sintering may be further subjected to surface polishing in order to adjust a thickness and a surface roughness appropriate for properties required in the embodiment. At this time, the ceramic photo-conversion member is ground until the ceramic photo-conversion member has a thickness of 200 to 1000 µm and a surface roughness of 0.1 to 0.3 µm.

Figure 3:
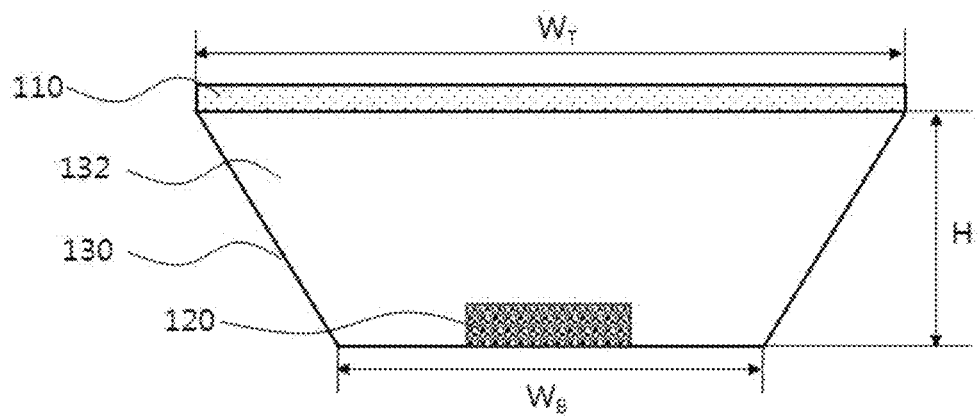
FIG. 3 is a cross-sectional view illustrating a schematic structure of a lighting device according to an embodiment of the present disclosure.

FIG. 3 is a cross-sectional view illustrating a schematic structure of a lighting device according to an embodiment of the present disclosure, Referring to FIG. 3, a lighting device according to the present embodiment of the disclosure may include the ceramic phosphor plate 110. The ceramic phosphor plate 110 is provided to be separated from a light source 120. A separation distance between the ceramic phosphor plate and the light source may range from 10 to 20 mm. Preferably, the separation distance may range from 12 to 18 mm. When the separation distance is more than 20 mm, light extraction may not be sufficiently performed. On the contrary, when the separation distance is less than 10 mm, the ceramic phosphor plate 110 may have thermal deformation caused by heat generated from the light source 120.

The lighting device includes a housing 130 in which a width is gradually increased upwards from a bottom surface with the light source 120 as its center. An optical element for emitting light, such as a solid light emitting element, may be applied as the light source 120. Any one selected from among an LED (Light Emitting Diode), an OLED (Organic Light Emitting Diode), an LD (Laser Diode), a laser, and a VCSEL (Vertical Cavity Surface Emitting Laser) may be applied as the solid light emitting element. The ceramic phosphor plate 110 is provided at an upper end portion of the housing to be separated from the light source 120. As described above, the ceramic phosphor plate 110 includes a matrix composed of a glass frit and a ceramic phosphor dispersed in the matrix. The inside of the housing 132 may be filled with a material having a higher refractive index than that of the ceramic photo-conversion member 110 or the same refractive index as that of the ceramic phosphor plate 110.

Also, an optical property may be measured with an integrating sphere having such a form. Light scattered by the interior of the integrating sphere is evenly distributed over all angles, and the integrating sphere enables the light to be distributed on a surface of the integrating sphere with the regular intensity of illumination by entirely collecting light reflected from the surface of a sample. A special paint, a PTFE (polytetrafluoroethylene) or the like may be used as a coating material for an internal wall of the integrating sphere. The interior of the integrating sphere should not be contaminated. In the case of spectral transmittance, when a light transmitted without a sample is 100%, a ratio for completely blocking light using an opaque object such as an iron plate and the like is 0%. When a transmission color has a large dispersion effect in a transmission material, the optical property may be measured using the integrating sphere.

The integrating sphere is prepared in a size in which the width WT of ranges from 55 to 60 mm, the width WB of a lower end portion ranges from 35 to 40 mm, and a height H ranges from 15 to 20 mm. First, in a state where there is no ceramic phosphor plate 110, the radiant flux of a blue LED corresponding to the light source 120 is measured. Then, the ceramic phosphor plate 110 is mounted, and a luminous flux (lumens) is measured. After this, the value of the luminous divided by the value of the radiant flux may give the value of light efficiency.

The present disclosure will be hereinafter described in greater detail based on examples. The examples have been disclosed for illustrative purposes and the present disclosure may, however, be embodied in different forms and should not be construed as limited to the examples set forth herein.

PRODUCTION EXAMPLE

Production of Glass Frit

Production Examples 1 to 4

According to compositional conditions indicated in Table 1, weighing of the materials of oxides and a carbonate compound was performed, and thereafter, the materials were put in a ball mill and were then mixed for 48 hours. Mixed powder was put in a platinum crucible and was melted at a temperature of 1300° C. for 30 minutes, and thereafter, the melted material was injected into a twin roller and was subjected to quenching, thereby obtaining a glass cullet. The glass cullet was put into the ball mill again and was pulverized until the glass cullet has a particle diameter of less than 10 μm, thereby obtaining a glass frit.

EXAMPLE

Production of Phosphor Plate

Examples 1 to 4

7 mol % of a LuAg phosphor in the range of 530 to 560 nm and 2 mol % of a nitride phosphor in the range of 630 to 690 nm were added to each glass frit produced in Production Examples 1 to 4 and were sufficiently mixed. The obtained mixture was put into a SUS mold (having a molded material thickness of 1000 μm) and was subjected to uniaxial compression at 5 tons for 5 minutes, thereby obtaining a compressed molded material. The compressed molded material was subjected to firing in a firing furnace at a temperature of 630° C. for 30 minutes, and was then subjected to mirror-like surface processing so as to have a surface roughness of 0.2 μm, thereby obtaining each phosphor plate.

The results of measuring transmittance of each phosphor plate are shown in Table 1.

TABLE 1

| | Example 1 | Example 2 | Example 3 | Example 4 |
|---|---|---|---|---|
| ZnO | 29 | 29 | 29 | 29 |
| $B_2O_3$ | 21 | 18 | 15 | 15 |
| $P_2O_3$ | — | — | — | 5 |
| $Al_2O_3$ | 3 | 3 | 3 | 3 |
| $K_2CO_3$ | 10 | 10 | 10 | 10 |
| $Na_2CO_3$ | 3 | 4 | 5 | 3 |
| $K_2O$ | — | — | — | — |
| $Li_2CO_3$ | — | — | — | — |
| $SiO_2$ | 34 | 36 | 38 | 35 |
| Transmittance (%) | 46.4 | 47.6 | 42.3 | 51.4 |

※ Component Unit: mol %

COMPARATIVE EXAMPLE

Each phosphor plate having compositional conditions as shown in Table 2 below were obtained by the same method as that of the production examples and the examples, and transmittance of each of the phosphor plates was measured.

TABLE 2

| | Comparative Example 1 | Comparative Example 2 | Comparative Example 3 |
|---|---|---|---|
| ZnO | 37 | 37 | 37 |
| $B_2O_3$ | 30 | 32 | 32 |
| $P_2O_3$ | — | — | — |
| $Al_2O_3$ | 2 | 2 | 2 |
| $K_2CO_3$ | — | — | — |
| $Na_2CO_3$ | — | — | — |
| $K_2O$ | 9 | 9 | 9 |
| $Li_2CO_3$ | 2 | — | 2 |
| $SiO_2$ | 20 | — | 18 |
| Transmittance (%) | 50.7 | 51.0 | 51.5 |

※ Component Unit: mol %

[Test]
1. High Acceleration Reliability Test (based on JEDEC)

Reliability of the phosphor plates of Examples 1, 2 and 4, and Comparative Examples 1 to 3 was verified at an atmosphere pressure of 2, a temperature of 121° C., and a humidity of 100% (based on JEDEC (Joint Electron Device Engineering Council))

In the case of the phosphor plates of the comparative examples, whitening was generated within 48 hours. In the case of the phosphor plates of the examples, whitening was generated within at least 96 hours. The results of the reliability test and the measurement of optical properties are shown in Tables 3 and 4.

TABLE 3

|  | Blue | Example 1 | | | | Example 2 | | | |
| --- | --- | --- | --- | --- | --- | --- | --- | --- | --- |
|  |  | Before the Test | | After the Test | | Before the Test | | After the Test | |
| Radiant flux (W) | 2.7 | 1.5 | 1.4 | 1.6 | 1.5 | 1.4 | 1.4 | 1.5 | 1.5 |
| Luminous Flux (lumens) | 96.3 | 477.3 | 474.0 | 466.8 | 455.5 | 456.2 | 457.6 | 453.2 | 450.7 |
| Color Coordinate (Cx) | 0.1526 | 0.4124 | 0.421 | 0.4144 | 0.4208 | 0.4281 | 0.4238 | 0.4236 | 0.4289 |
| Color Coordinate (Cy) | 0.0291 | 0.3924 | 0.3995 | 0.3926 | 0.3996 | 0.3991 | 0.396 | 0.3953 | 0.3997 |
| Color Temperature (K) | 0 | 3345.8 | 3246.9 | 3320.8 | 3252.4 | 3112.8 | 3164.7 | 3164.3 | 3103.1 |
| Light Efficiency (lm/Wrad) | 0 | 175.4 | 174.2 | 175.16 | 170.92 | 167.7 | 168.2 | 170.06 | 169.12 |
| CRI (RA) | 0 | 80 | 79.1 | 80.3 | 80 | 78.8 | 79.2 | 80 | 79.6 |
| Reliability Test (Light Efficiency Δ3% Cx, Cy Δ0.006) | shift | ΔLight Efficiency: −0.01% ΔCx: −0.0009 ΔCy: −0.0011 | | | | ΔLight Efficiency: 1.00% ΔCx: −0.0003 ΔCy: −0.0001 | | | |
| Result |  | PASS | | | | PASS | | | |

TABLE 4

|  | Blue | Example 4 | | | |
| --- | --- | --- | --- | --- | --- |
|  |  | Before the Test | | After the Test | |
| Radiant flux (W) | 2.7 | 1.4 | 1.4 | 1.5 | 1.5 |
| Luminous Flux (lumens) | 96.3 | 45.3 | 455.0 | 445.8 | 447.8 |
| Color Coordinate (Cx) | 0.1526 | 0.423 | 0.415 | 0.4218 | 0.4155 |
| Color Coordinate (Cy) | 0.0291 | 0.3969 | 0.3835 | 0.3952 | 0.3849 |
| Color Temperature (K) | 0 | 3187.9 | 3229.4 | 3197.3 | 3231.7 |
| Light Efficiency (lm/Wrad) | 0 | 167.7 | 167.2 | 167.28 | 168.03 |
| CRI (RA) | 0 | 79.5 | 80.5 | 80.3 | 81.2 |
| Reliability Test (Light EfficiencyΔ3% Cx, Cy Δ0.006) | shift | ΔLight Efficiency: 0.12% ΔCx: −0.0004 ΔCy: −0.0001 | | | |

2. Accelerated Life Test (ALT)

Each of the phosphor plates was left in a high temperature and humidity environment (85° C. and 85%) for 1000 hours pursuant to the requirements for reliability of an LED, and reliability and optical properties thereof were then measured. The results are shown in Tables 5 and 6.

Figure 4:
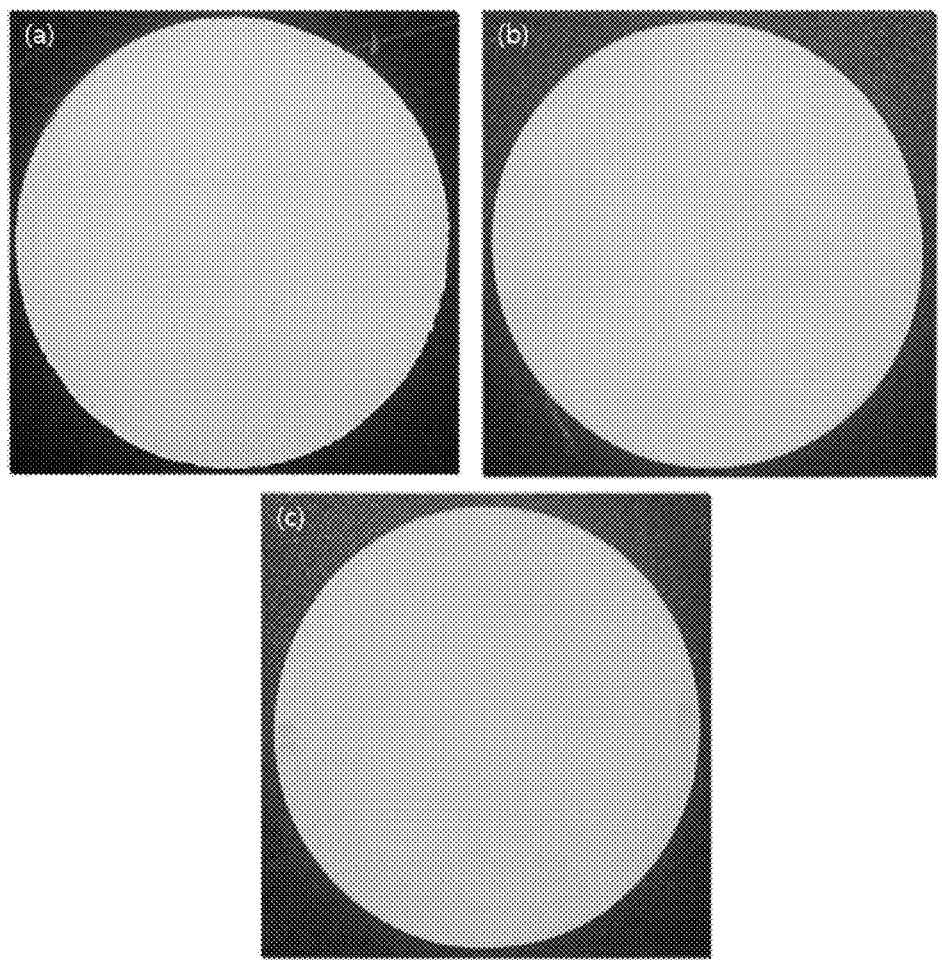
FIG. 4 is a photo resulting from capturing each surface of phosphor plates produced in Examples 1 to 3 after performing a high temperature and humidity test for 1000 hours with regard to the phosphor plates.
Figure 5:
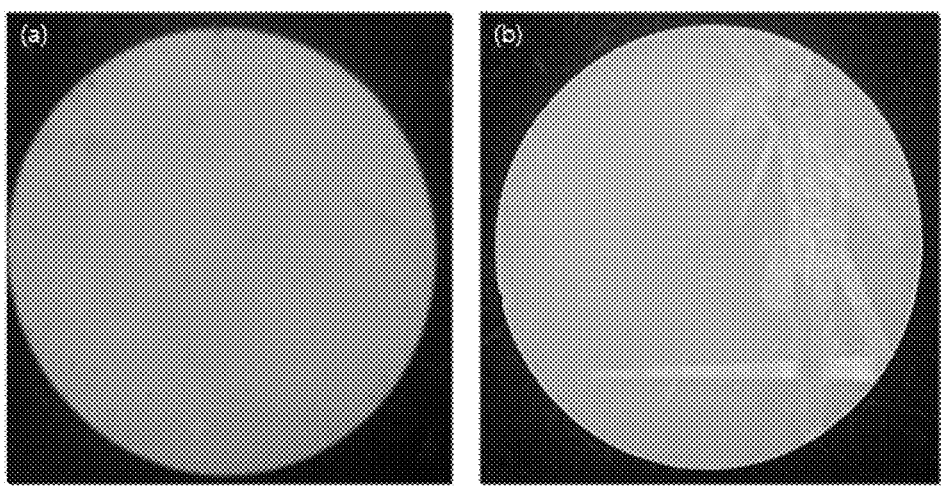
FIG. 5 is a photo resulting from capturing a front surface (A) and a rear surface (B) of a phosphor plate produced in a comparative example after performing a high temperature and humidity test for 1000 hours with regard to the phosphor plates.

Also, each surface of the phosphor plates was observed and was illustrated in FIGS. 4 and 5. FIG. 4 shows a photo resulting from capturing each surface of the phosphor plates after the test performed in the high temperature and humidity for 1000 hours for the phosphor plates produced in Examples 1 to 4, and FIG. 5 is a photo resulting from capturing a front surface (A) and a rear surface (B) of the phosphor plate after the test performed in the high temperature and humidity for 1000 hours for the phosphor plate produced in the comparative examples.

TABLE 5

|  |  | 1 | | 2 | | 3 | | 4 | | 5 | |
| --- | --- | --- | --- | --- | --- | --- | --- | --- | --- | --- | --- |
|  |  | Before | After | Before | After | Before | After | Before | After | Before | After |
| Radiant flux (W) |  | 1.59 | 1.5 | 1.55 | 1.45 | 1.45 | 1.45 | 1.58 | 1.44 | 1.62 | 1.47 |
| Luminous Flux (lumens) |  | 480.3 | 484.3 | 503.7 | 504.7 | 499.6 | 501.6 | 502.8 | 501.3 | 506.9 | 508.5 |
| Color Coordinate (Cx) |  | 0.4132 | 0.4153 | 0.4339 | 0.4363 | 0.4371 | 0.4396 | 0.434 | 0.436 | 0.4312 | 0.4338 |
| Color Coordinate (Cy) |  | 0.3889 | 0.3922 | 0.4267 | 0.4309 | 0.4275 | 0.4315 | 0.4266 | 0.4309 | 0.4236 | 0.4284 |
| Color Temperature (K) |  | 3314 | 3299 | 3226 | 3215 | 3178 | 3167 | 3223 | 3220 | 3249 | 3240 |
| Light Efficiency (lm/Wrad) |  | 175.0 | 175.7 | 183.6 | 183.1 | 182.1 | 182.0 | 183.2 | 181.9 | 184.7 | 184.5 |
| CRI (RA) |  | 80.5 | 79.9 | 76.4 | 75.3 | 76.3 | 75.1 | 76 | 75.2 | 76.6 | 75.8 |
| Evaluation of reliability | ΔCx | 0.0021 | | 0.0024 | | 0.0025 | | 0.002 | | 0.0026 | |

TABLE 6

| | | 6 | | 7 | | 8 | | 9 | | 10 |
|---|---|---|---|---|---|---|---|---|---|---|
| | | Before | After | Before | After | Before | After | Before | After | Before | After |
| Radiant flux (W) | | 1.60 | 1.47 | 1.58 | 1.4 | 1.58 | 1.45 | 1.56 | 1.43 | 1.58 | 1.44 |
| Luminous Flux (lumens) | | 506.7 | 509.1 | 471.1 | 467.4 | 471.2 | 475.4 | 470.2 | 471.2 | 494.9 | 495.5 |
| Color Coordinate(Cx) | | 0.4282 | 0.4311 | 0.4238 | 0.4253 | 0.4293 | 0.4255 | 0.4227 | 0.4258 | 0.4385 | 0.4413 |
| Color Coordinate(Cy) | | 0.4214 | 0.4263 | 0.3979 | 0.4033 | 0.403 | 0.4021 | 0.3981 | 0.4023 | 0.4251 | 0.4299 |
| Color Temperature (K) | | 3285 | 3272 | 3181 | 3197 | 3122 | 3184 | 3204 | 3181 | 3136 | 3126 |
| Light Efficiency (lm/Wrad) | | 184.7 | 184.7 | 171.7 | 169.6 | 171.7 | 172.5 | 171.4 | 171.0 | 180.4 | 179.8 |
| CRI (RA) | | 76.9 | 75.7 | 80.3 | 79.1 | 78.9 | 79.3 | 79.7 | 79.3 | 76.8 | 76.2 |
| Evaluation of reliability | ΔCx | 0.0029 | | 0.0015 | | −0.0038 | | 0.0031 | | 0.0028 | |
| | ΔCy | 0.0049 | | 0.0054 | | −0.0009 | | 0.0042 | | 0.0048 | |
| | ΔEfficiency | 0.04% | | −1.22% | | 0.45% | | −0.22% | | −0.31% | |
| | Result | PASS | | PASS | | PASS | | PASS | | PASS | |

As set forth above, according to some embodiment of the present disclosure, a ceramic phosphor plate having high reliability can be implemented using a glass composition for the ceramic phosphor plate, including: 75 to 85 mol % of an oxide mixture composed of $SiO_2$, $B_2O_3$ and ZnO; 10 to 15 mol % of at least one carbonate compound including an alkali metal; and 1 to 5 mol % of $Al_2O_3$, wherein a content of $B_2O_3$ is less than 25 mol %. Thus, even though the ceramic phosphor plate is exposed in a high temperature and humidity environment, whitening of the ceramic phosphor plate can be prevented, and the ceramic phosphor plate can have high reliability and high optical properties.

As previously described, in the detailed description of the disclosure, having described the detailed exemplary embodiments of the disclosure, it should be apparent that modifications and variations can be made by persons skilled without deviating from the spirit or scope of the disclosure. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims and their equivalents.

The present disclosure has been made keeping in mind the above problems, an aspect of embodiments of the present disclosure provides a glass composition for a ceramic phosphor plate, and a ceramic phosphor plate including the glass composition, the glass composition including: 75 to 85 mol % of an oxide mixture composed of $SiO_2$, $B_2O_3$ and ZnO; 10 to 15 mol % of at least one carbonate compound containing an alkali metal; and 1 to 5 mol % of $Al_2O_3$, wherein a content of the $B_2O_3$ is less than 25 mol %.

According to an aspect of embodiments of the present disclosure, a glass composition for a ceramic phosphor plate may include: 75 to 85 mol % of an oxide mixture composed of $SiO_2$, $B_2O_3$ and ZnO; 10 to 15 mol % of at least one carbonate compound containing an alkali metal; and 1 to 5 mol % of $Al_2O_3$, wherein a content of the $B_2O_3$ is less than 25 mol %.

Also, according to another aspect of embodiments of the present disclosure, a ceramic phosphor plate, including a matrix composed of a glass frit having an average particle diameter of 1 to 10 μm obtained by vitrification of the glass composition, and at least one phosphor.

Also, according to further aspect of embodiments of the present disclosure, a lighting device may include the ceramic phosphor plate.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A glass composition for a phosphor plate, comprising:
   75 to 85 mol % of an oxide mixture composed of $SiO_2$, $B_2O_3$ and ZnO;
   10 to 15 mol % of at least one carbonate compound including an alkali metal; and
   1 to 5 mol % of $Al_2O_3$,
   wherein a content of $B_2O_3$ is less than 25 mol %, and
   wherein the carbonate compound including the alkali metal is at least one compound selected from the group consisting of $K_2CO_3$, $Na_2CO_3$, and a mixture thereof.

2. The glass composition of claim 1, wherein a ratio of the ZnO to $B_2O_3$ ranges from 0.35 to 0.75.

3. The glass composition of claim 1, further comprising 5 mol % or less of an additional component.

4. The glass composition of claim 3, wherein the additional component is $P_2O_5$.

5. The glass composition of claim 1, wherein a content of the $B_2O_3$ is less than 15 mol %.

6. A phosphor plate, comprising:
   a matrix composed of a glass frit having an average particle diameter of 1 to 10 μm obtained by vitrification of a glass composition of claim 1; and
   at least one phosphor.

7. The phosphor plate of claim 6, wherein the phosphor is at least one phosphor selected from the group consisting of an yttrium aluminum garnet (YAG)-based phosphor, a lutetium aluminum garnet (LuAG)-based phosphor, a nitride-based phosphor, a sulfide-based phosphor, a silicate-based phosphor, and a mixture thereof.

8. The phosphor plate of claim 6, wherein the phosphor is contained in an amount of 1 to 15 mol % in a mixture containing the glass fit and the phosphor.

9. A lighting device, comprising:
the phosphor plate of claim 6.

10. The lighting device of claim 9, further comprising:
a light source emitting light, wherein the phosphor plate is provided to be separated from the light source.

11. The lighting device of claim 10, wherein the light source is at least one element selected from the group consisting of an LED (Light Emitting Diode), an OLED (Organic Light Emitting Diode), an LD (Laser Diode), a laser, and a VCSEL (Vertical Cavity Surface Emitting Laser).

12. The lighting device of claim 10, wherein a separation distance between the phosphor plate and the light source ranges from 10 to 20 mm.

13. The lighting device of claim 10, further comprising a housing in which the light source and the phosphor plate are accommodated.

14. The lighting device of claim 13, wherein the housing has a structure in which a width of the housing is gradually increased upwards from a bottom portion at which the light source is provided.

15. The lighting device of claim 14, further comprising a filling material filled in the inside of the housing and having a higher refractive index than that of the phosphor plate.

* * * * *